(12) United States Patent
Makita et al.

(10) Patent No.: US 9,985,055 B2
(45) Date of Patent: May 29, 2018

(54) SEMICONDUCTOR DEVICE AND METHOD FOR MANUFACTURING SAME

(71) Applicant: Sharp Kabushiki Kaisha, Osaka-shi, Osaka (JP)

(72) Inventors: Naoki Makita, Osaka (JP); Satoru Tone, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days. days.

(21) Appl. No.: 15/027,724

(22) PCT Filed: Aug. 15, 2014

(86) PCT No.: PCT/JP2014/071475
§ 371 (c)(1),
(2) Date: Apr. 7, 2016

(87) PCT Pub. No.: WO2015/052991
PCT Pub. Date: Apr. 16, 2015

(65) Prior Publication Data
US 2016/0247831 A1    Aug. 25, 2016

(30) Foreign Application Priority Data

Oct. 9, 2013 (JP) ................................ 2013-212000

(51) Int. Cl.
*H01L 27/12* (2006.01)
*H01L 29/40* (2006.01)
(Continued)

(52) U.S. Cl.
CPC ...... *H01L 27/1277* (2013.01); *H01L 27/1225* (2013.01); *H01L 27/1237* (2013.01);
(Continued)

(58) Field of Classification Search
CPC .......................... H01L 27/1225; H01L 29/401
See application file for complete search history.

(56) References Cited

U.S. PATENT DOCUMENTS 7,612,375 B2    11/2009  Makita
2007/0072439 A1 *  3/2007  Akimoto ............. H01L 27/1225
438/795

(Continued)

FOREIGN PATENT DOCUMENTS

JP    2010-003910 A    1/2010
JP    2010003910    *    1/2010
(Continued)

OTHER PUBLICATIONS

Official Communication issued in International Patent Application No. PCT/JP2014/071475, dated Nov. 4, 2014.
(Continued)

*Primary Examiner* — Moazzam Hossain
*Assistant Examiner* — Farun Lu
(74) *Attorney, Agent, or Firm* — Keating & Bennett, LLP

(57) ABSTRACT

A semiconductor device (100) includes: a substrate (11); a first thin film transistor (10A) supported on the substrate (11), the first thin film transistor (10A) having a first active region (13c) which mainly contains a crystalline silicon; and a second thin film transistor (10B) being supported on the substrate (11), the second thin film transistor (10B) having a second active region (17c) which mainly contains an oxide semiconductor having a crystalline portion.

13 Claims, 10 Drawing Sheets

(51) Int. Cl.
*H01L 29/786* (2006.01)
*H01L 21/02* (2006.01)

(52) U.S. Cl.
CPC ...... *H01L 27/1248* (2013.01); *H01L 27/1251* (2013.01); *H01L 27/1274* (2013.01); *H01L 27/1288* (2013.01); *H01L 29/401* (2013.01); *H01L 29/7869* (2013.01); *H01L 21/02554* (2013.01); *H01L 21/02565* (2013.01); *H01L 29/78672* (2013.01)

(56) References Cited

U.S. PATENT DOCUMENTS

| | | | |
|---|---|---|---|
| 2011/0017995 A1* | 1/2011 | Yamazaki | H01L 27/124 257/59 |
| 2011/0101332 A1 | 5/2011 | Yamazaki et al. | |
| 2011/0242070 A1 | 10/2011 | Yamazaki et al. | |
| 2011/0248270 A1* | 10/2011 | Fukumoto | H01L 29/517 257/59 |
| 2012/0132905 A1* | 5/2012 | Yamazaki | H01L 29/4908 257/43 |
| 2012/0138922 A1 | 6/2012 | Yamazaki et al. | |
| 2012/0261657 A1* | 10/2012 | Takahashi | H01L 29/7869 257/43 |
| 2012/0299887 A1* | 11/2012 | Tanaka | G09G 3/3688 345/204 |
| 2014/0054582 A1* | 2/2014 | Yamazaki | H01L 33/0041 257/43 |
| 2014/0131703 A1 | 5/2014 | Miyamoto et al. | |

FOREIGN PATENT DOCUMENTS

| | | | | |
|---|---|---|---|---|
| JP | 2010003910 | A * | 1/2010 | ........... H01L 29/786 |
| JP | 2010003910 | A * | 1/2010 | ........... H01L 29/786 |
| JP | 2011-119672 | A | 6/2011 | |
| JP | 2011-227479 | A | 11/2011 | |
| JP | 2012-134475 | A | 7/2012 | |
| JP | 2013-191852 | A | 9/2013 | |
| WO | 2012/176422 | A1 | 12/2012 | |

OTHER PUBLICATIONS

Makita et al., "Semiconductor Device and Method for Manufacturing Same", U.S. Appl. No. 15/292,442, filed Oct. 13, 2016.

* cited by examiner

SEMICONDUCTOR DEVICE AND METHOD FOR MANUFACTURING SAME

TECHNICAL FIELD

The present invention relates to a semiconductor device and a method of producing the same.

BACKGROUND ART

An active matrix substrate includes a switching element for each pixel, e.g., a thin film transistor (hereinafter, "TFT"). In the present specification, such a TFT will be referred to as a "pixel TFT". As pixel TFTs, amorphous silicon TFTs whose active layers are an amorphous silicon film, and crystalline silicon TFTs whose active layers are a crystalline silicon film such as a polycrystalline silicon film, have been widely used.

In some cases, a part or a whole of a peripheral driving circuit may be integrally formed on the same substrate as the pixel TFTs. Such an active matrix substrate is referred to as a driver-monolithic active matrix substrate. In a driver-monolithic active matrix substrate, the peripheral driving circuit is to be provided in a region (a non-display region or a frame region) other than the region that contains a plurality of pixels (display region). The pixel TFTs and the TFTs composing the driving circuit (circuit TFTs) may be formed by using the same semiconductor film. As this semiconductor film, for example, a polycrystalline silicon film with a high field-effect mobility may be used.

Moreover, it has been proposed to use an oxide semiconductor as the material of the active layers of TFTs, instead of an amorphous silicon or a polycrystalline silicon. It has also been proposed to use, as an oxide semiconductor, an In—Ga—Zn—O type semiconductor whose main components are indium, gallium, zinc, and oxygen. These TFTs are called "oxide semiconductor TFTs". An oxide semiconductor provides a higher mobility than does an amorphous silicon. Therefore, oxide semiconductor TFTs can operate more rapidly than amorphous silicon TFTs. Moreover, an oxide semiconductor film is formed through a simple process as compared to a polycrystalline silicon film, and therefore is applicable to devices which require a large geometric area. Therefore, by using an oxide semiconductor film, it also becomes possible to form pixel TFTs and circuit TFTs integrally on the same substrate.

However, regardless of whether a polycrystalline silicon film or an oxide semiconductor film is used, it is difficult to adequately satisfy the characteristics that are required of both pixel TFTs and circuit TFTs.

On the other hand, Patent Document 1 discloses an active-matrix type liquid crystal panel including oxide semiconductor TFTs as the pixel TFTs and TFTs whose active layers are a non-oxide semiconductor film (e.g., crystalline silicon TFTs) as the circuit TFTs. In the liquid crystal panel of Patent Document 1, the oxide semiconductor TFTs and the crystalline silicon TFTs are formed on the same substrate. Patent Document 1 states that use of oxide semiconductor TFTs as the pixel TFTs can reduce display unevenness, and that use of crystalline silicon TFTs as the circuit TFTs enables rapidly driving.

CITATION LIST

Patent Literature

[Patent Document 1] Japanese Laid-Open Patent Publication No. 2010-3910

SUMMARY OF INVENTION

Technical Problem

In recent years, liquid crystal panels, as in smartphones and the like, are required to attain higher resolution, narrower frames, and lower power consumption. To attain a "narrow(er) frame" means to reduce the area that is required for the driving circuit, thus reducing the region other than the display region (frame region). According to a study by the inventors, the construction disclosed in Patent Document 1 may have difficulties in realizing higher resolution and narrower frames in liquid crystal panels. Moreover, since the oxide semiconductor TFTs and the crystalline silicon TFTs are integrally formed, it may be difficult to satisfy the characteristics which are required of these TFTs respectively. The details thereof will be described later.

An embodiment of the present invention has been made in view of the above circumstances, and provides a semiconductor device which can attain a higher resolution and a narrower frame, as well as a method of producing the same.

Solution to Problem

A semiconductor device according to an embodiment of the present invention comprises: a substrate; a first thin film transistor supported on the substrate, the first thin film transistor having a first active region which mainly contains a crystalline silicon; and a second thin film transistor supported on the substrate, the second thin film transistor having a second active region which mainly contains an oxide semiconductor having a crystalline portion.

In one embodiment, a layer in which the first active region is comprised and a layer in which the second active region is comprised are provided in separate layers, the semiconductor device further comprising an insulating layer interposed between the layers; when viewed from a normal direction of the substrate, the insulating layer overlaps both of the first active region and the second active region; and the insulating layer has a multilayer structure including a hydrogen donor layer capable of supplying hydrogen and an oxygen donor layer capable of supplying oxygen, the oxygen donor layer being located closer to the second active region than is the hydrogen donor layer.

One embodiment further comprises a first interlayer insulating film covering the first thin film transistor, wherein the insulating layer comprises the first interlayer insulating film and a gate insulating film of the second thin film transistor.

In one embodiment, in the insulating layer, the hydrogen donor layer mainly contains silicon nitride, and the oxygen donor layer mainly contains silicon oxide.

In one embodiment, a gate electrode of the first thin film transistor and a gate electrode of the second thin film transistor are formed in a same layer.

In one embodiment, a source electrode and a drain electrode of the first thin film transistor and a source electrode and a drain electrode of the second thin film transistor are formed in a same layer.

In one embodiment, the first thin film transistor has a top gate structure, and the second thin film transistor has a bottom gate structure.

One embodiment further has: a display region including a plurality of pixels; and a driving circuit forming region provided in a region other than the display region, the driving circuit forming region including a driving circuit, wherein the first thin film transistor composes the driving circuit in the driving circuit forming region; and the second thin film transistor is provided for each pixel of the display region.

In one embodiment, the driving circuit comprises a source shared driving circuit.

In one embodiment, the oxide semiconductor comprises an In—Ga—Zn—O type semiconductor.

In one embodiment, the crystalline silicon is a polycrystalline silicon.

A method of producing a semiconductor device according to an embodiment of the present invention is a method of producing a semiconductor device including a first thin film transistor and a second thin film transistor, the method comprising: step (A) of forming a crystalline silicon layer upon a substrate having an insulative surface, the crystalline silicon layer including a portion to become an active region of the first thin film transistor; step (B) of forming a first insulating layer upon the crystalline silicon layer; step (C) of forming gate electrodes of the first and second thin film transistors upon the first insulating layer; step (D) of forming a second insulating layer covering the gate electrodes of the first and second thin film transistors; step (E) of forming an amorphous oxide semiconductor layer upon the second insulating layer, the amorphous oxide semiconductor layer including a portion to become an active region of the second thin film transistor; step (F) of performing a heat treatment to effect hydrogenation of the crystalline silicon layer by supplying hydrogen from the second insulating layer to the crystalline silicon layer, and crystallize the amorphous oxide semiconductor layer to produce an oxide semiconductor layer having a crystalline portion; and step (G) of forming a source electrode and a drain electrode of the first thin film transistor being connected to the crystalline silicon layer and a source electrode and a drain electrode of the second thin film transistor being connected to the oxide semiconductor layer having a crystalline portion.

In one embodiment, at step (D), a multilayer film including a hydrogen donor layer capable of supplying hydrogen and an oxygen donor layer capable of supplying oxygen, the oxygen donor layer being disposed on the hydrogen donor layer, is formed as the second insulating layer.

In one embodiment, the hydrogen donor layer is a layer which mainly contains silicon nitride, and the oxygen donor layer is a layer which mainly contains silicon oxide.

In one embodiment, the first insulating layer comprises a gate insulating film of the first thin film transistor; and the second insulating layer comprises: an interlayer insulating film covering the first thin film transistor; and a gate insulating film of the second thin film transistor.

In one embodiment, step (A) comprises a step of forming an amorphous silicon film and a step of crystallizing the amorphous silicon film through laser irradiation.

In one embodiment, step (A) comprises: a step of forming an amorphous silicon film; a step of adding a metal catalyst to at least a portion of the amorphous silicon film; and a step of applying a heat treatment to the amorphous silicon film having the metal catalyst added thereto to crystallize at least the portion of the amorphous silicon film.

One embodiment further comprises, after step (G): step (H) of forming a third insulating layer; step (I) of forming an organic-type planarization film upon the third insulating layer; and step (J) of forming a pixel electrode upon the planarization film, wherein, the pixel electrode is connected to the source electrode or the drain electrode of the second thin film transistor in an aperture made in the third insulating layer and the planarization film.

One embodiment further comprises a step of making the aperture in the third insulating layer and the planarization film through a single photolithography step.

One embodiment further comprises, between step (I) and step (J): a step of forming a common electrode; and a step of forming a fourth insulation film on the common electrode.

One embodiment further comprises, after step (I): a step of forming a fourth insulation film; and a step of forming a common electrode on the fourth insulation film.

In one embodiment, the oxide semiconductor layer comprises an In—Ga—Zn—O type semiconductor.

Advantageous Effects of Invention

According to an embodiment of the present invention, it is possible to realize a semiconductor device having a higher resolution and a smaller frame region than conventional.

DESCRIPTION OF EMBODIMENTS

Figure 1:
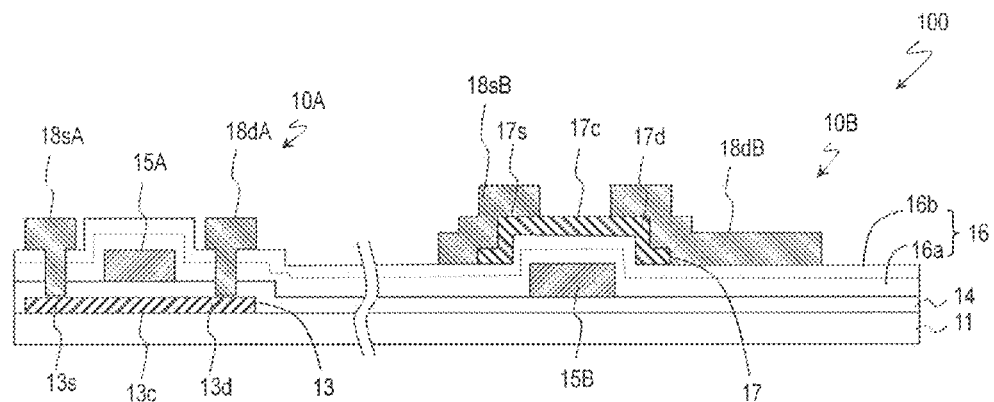
FIG. 1 A schematic cross-sectional view illustrating a first thin film transistor 10A and a second thin film transistor 10B of a semiconductor device 100 according to a first embodiment of the present invention.

Although depending on the application of the liquid crystal panel, a liquid crystal panel is required to have (1) an ultrahigh resolution, (2) a narrow frame, and (3) low power consumption. The inventors have studied panel structures which are able to satisfy these requirements in a good balance, arriving at the following findings.

In a liquid crystal panel in which a driver-monolithic active matrix substrate is used, adopting crystalline silicon TFTs as the pixel TFTs and as the circuit TFTs (this being referred to as a "crystalline silicon liquid crystal panel") allows the frame region to be narrowed, and a high-resolution liquid crystal panel to be constructed. However, this requires the liquid crystal panel to be driven at e.g. 60 Hz, which makes it difficult to suppress power consumption.

On the other hand, a liquid crystal panel in which amorphous oxide semiconductor TFTs are adopted as the pixel TFTs and as the circuit TFTs (this being referred to as an "amorphous oxide semiconductor liquid crystal panel"), power consumption can be reduced. The reason is that, when amorphous oxide semiconductor TFTs are used as the pixel TFTs, the small OFF-leakage current of amorphous oxide semiconductor (which is about $\frac{1}{1000}$ of that of polysilicon and about $\frac{1}{100}$ of that of amorphous silicon) allows them to be driven at e.g. 1 Hz (i.e., resting for 59/60 seconds) in displaying a still image, thereby being able to reduce the power required for image displaying. Moreover, transmittance can be improved, and high affinity is provided for touch-screen panels; therefore, a high-resolution liquid crystal panel can be constructed. However, since amorphous oxide semiconductor TFT are adopted also as the circuit TFTs, it is difficult to reduce the frame region. Amorphous oxide semiconductor has a lower mobility than that of crystalline silicon. For example, an amorphous In—Ga—Zn—O type semiconductor, which is an amorphous oxide semiconductor, has a mobility on the order of 20 cm$^2$/Vs, as compared to the 100 cm$^2$/Vs mobility of a low-temperature polysilicon. Therefore, a large device area is required in order to provide for the necessary current in the driving circuit, thus resulting in an increased circuitry area, which pushes up the size of the frame region of the liquid crystal panel.

Thus, crystalline silicon TFTs and amorphous oxide semiconductor TFTs have their own advantages and disadvantages, which make it difficult to realize a liquid crystal panel that satisfies the aforementioned liquid crystal panel requirements in a good balance at a highly sophisticated level.

On the other hand, as is disclosed in Patent Document 1, when amorphous oxide semiconductor TFTs are used as the pixel TFTs and crystalline silicon TFTs are used as the circuit TFTs, power consumption can be smaller than in the case of using crystalline silicon TFTs alone. However, according to a study by the inventors, the less-than-sufficiently-high mobility of the amorphous oxide semiconductor leads to the following problems. In each pixel, there is a possibility that further reduction in the device area of the amorphous oxide semiconductor TFTs is difficult, thus not being able to meet the requirement of higher resolution. It is also difficult to further reduce the time required to supply a predetermined charge to a pixel. For this reason, a source shared driving (hereinafter "SSD") circuit which inputs signals to source bus lines, for example, cannot be adopted for the driving circuit; thus, it is difficult to realize a narrow frame on the basis of an SSD circuit. This may potentially make it impossible to reduce the area of the frame region especially at the terminal side.

The inventors have conducted their studies based on the above findings. As a result, it has been found that by crystallizing the oxide semiconductor layer of pixel TFTs, it becomes possible to realize a higher resolution while ensuring low power consumption. Moreover, using an oxide semiconductor layer which has crystallized (hereinafter abbreviated as a "crystalline oxide semiconductor layer") allows the pixels to be charged within a write time of an SSD circuit, due to an improved mobility. Therefore, it also allows an SSD circuit to be utilized in order to make the frame region narrower than conventional.

Moreover, upon further studies by the inventors, it has been found that, when an insulating layer is used that is common to TFTs in which a crystalline oxide semiconductor is used (crystalline oxide semiconductor TFTs) and crystalline silicon TFTs, this insulating layer serves an important function in guaranteeing the characteristics and reliability of the crystalline silicon TFTs and the crystalline oxide semiconductor TFTs. Through the use of an insulating layer of a predetermined structure, it becomes possible to suppress characteristic deteriorations in the active layers of the crystalline silicon TFTs and the crystalline oxide semiconductor TFTs. Note that Patent Document 1 fails to describe any material or structure for an insulating layer to be used in common for the two types of TFTs.

In outline, a semiconductor device according to an embodiment of the present invention is as follows.

A semiconductor device according to an embodiment of the present invention includes crystalline silicon TFTs and crystalline oxide semiconductor TFTs on the same substrate. With such a construction, it is possible to allocate crystalline oxide semiconductor TFTs and crystalline silicon TFTs to different characteristics that are required of the respective TFTs. By using crystalline silicon TFTs as the circuit elements, for example, it becomes possible to reduce the circuitry area. On the other hand, using TFTs in which a crystalline oxide semiconductor is used makes it possible to realize a semiconductor device having a higher resolution while reducing power consumption. Furthermore, when applied to an active matrix substrate of a liquid crystal panel, for example, it is possible to further reduce the frame region through the utilization of an SSD circuit.

In the present specification, a "crystalline silicon TFT" refers to a TFT which includes an active region (i.e., a region in which a channel is formed) that mainly contains crystalline silicon, including for example crystalline silicon TFTs, single-crystalline silicon TFTs, and so on. A "crystalline oxide semiconductor TFT" refers to a TFT which includes an active region that mainly contains an oxide semiconductor having a crystalline portion. An "oxide semiconductor having a crystalline portion" includes a film obtained by partially crystallizing an amorphous oxide semiconductor film, for example.

A layer that includes the active regions of crystalline silicon TFTs (active layer) and the active layer of crystalline oxide semiconductor TFTs may be provided in separate layers, such that an insulating layer existing between these layers is disposed so as to overlap both of the active layers of the crystalline silicon TFTs and the crystalline oxide TFTs when viewed from the normal direction of the substrate. The insulating layer may have a multilayer structure including a hydrogen donor layer capable of supplying hydrogen and an oxygen donor layer capable of supplying oxygen, the oxygen donor layer being located closer to the crystalline oxide semiconductor layer than is the hydrogen donor layer. As a result of this, the hydrogen donor layer can reduce crystal defects occurring in the active layer of the crystalline silicon TFTs, while the oxygen donor layer can suppress deteriorations caused by oxygen defects in the crystalline oxide semiconductor layer.

First Embodiment

Hereinafter, a first embodiment of a semiconductor device according to the present invention will be described. The semiconductor device of the present embodiment may at least include crystalline oxide semiconductor TFTs and crystalline silicon TFTs which are formed on the same substrate, and broadly encompasses circuit boards, e.g., active matrix substrates, various display devices, e.g., liquid crystal display devices and organic EL display devices, image sensors, electronic appliances, and the like.

FIG. 1 is a schematic cross-sectional view of the semiconductor device 100, showing a cross-sectional structure of a crystalline silicon TFT (hereinafter, referred to as a "first thin film transistor") 10A and a crystalline oxide semiconductor TFT (hereinafter referred to as a "second thin film transistor") 10B in the semiconductor device 100.

The semiconductor device 100 includes a substrate 11, the first thin film transistor 10A supported on the substrate 11, and the second thin film transistor 10B supported on the substrate 11. The first thin film transistor 10A has an active region that mainly contains crystalline silicon. The second thin film transistor 10B has an active region that mainly contains an oxide semiconductor having a crystalline portion. The first thin film transistor 10A and the second thin film transistor 10B are fabricated in an integral manner into the substrate 11. As used herein, within the semiconductor layer to become an active layer of a TFT, an "active region" refers to a region where a channel is to be formed.

The first thin film transistor 10A includes a crystalline silicon semiconductor layer (e.g., a low-temperature polysilicon layer) 13 formed on the substrate 11, a first insulating layer 14 covering the crystalline silicon semiconductor layer 13, and a gate electrode 15A provided on the first insulating layer 14. The portion of the first insulating layer 14 that is located between the crystalline silicon semiconductor layer 13 and the gate electrode 15A functions as a gate insulating film of the first thin film transistor 10A. The crystalline silicon semiconductor layer 13 has a region (active region) 13c in which a channel is to be formed, and a source region 13s and a drain region 13d respectively located on opposite sides of the active region. In this example, a portion of the crystalline silicon semiconductor layer 13 that overlaps the gate electrode 15A via the first insulating layer 14 defines the active region 13c. The first thin film transistor 10A also includes a source electrode 18sA and a drain electrode 18dA which are respectively connected to the source region 13s and the drain region 13d. The source and drain electrodes 18sA and 18dA may be provided on an interlayer insulating film (which herein is a second insulating layer 16) covering the gate electrode 15A and the crystalline silicon semiconductor layer 13, and connected to the crystalline silicon semiconductor layer 13 within contact holes which are formed in the interlayer insulating film.

The second thin film transistor 10B includes a gate electrode 15B provided on the substrate 11, a second insulating layer 16 covering the gate electrode 15B, and a crystalline oxide semiconductor layer 17 on the second insulating layer 16. As shown in the figure, the first insulating layer 14, which is the gate insulating film of the first thin film transistor 10A, may extend to the region where the second thin film transistor 10B is to be formed. In this case, the crystalline oxide semiconductor layer 17 may be formed on the first insulating layer 14. A portion of the second insulating layer 16 that is located between the gate electrode 15B and the crystalline oxide semiconductor layer 17 functions as a gate insulating film of the second thin film transistor 10B. The crystalline oxide semiconductor layer 17 has a region (active region) 17c in which a channel is to be formed, and a source contact region 17s and a drain contact region 17d respectively located on opposite sides of the active region. In this example, a portion of the crystalline oxide semiconductor layer 17 that overlaps the gate electrode 15B via the second insulating layer 16 defines the active region 17c. Moreover, the second thin film transistor 10B further includes a source electrode 18sB and a drain electrode 18dB which are respectively connected to the source contact region 17s and the drain contact region 17d.

Because of the above construction, the semiconductor device 100 allows the first and second thin film transistors 10A and 10B to be allocated to different characteristics that are required of the respective TFTs. Moreover, since the second thin film transistor 10B utilizes as an active region a crystalline oxide semiconductor whose mobility is enhanced over that of amorphous oxide semiconductor, it becomes possible to realize a semiconductor device having a higher resolution while reducing power consumption.

In the example shown in the figure, the first thin film transistor 10A has a top gate structure in which the crystalline silicon semiconductor layer 13 is disposed between the gate electrode 15A and the substrate 11. On the other hand, the second thin film transistor 10B has a bottom gate structure in which the gate electrode 15B is disposed between the crystalline oxide semiconductor layer 17 and the substrate 11. By adopting such a structure, when forming the two types of thin film transistors 10A and 10B in an integral manner on the same substrate 11, it is possible to more effectively suppress increase in the number of production steps and the production cost.

The TFT structures of the first thin film transistor 10A and the second thin film transistor 10B are not limited to the above. For example, the thin film transistors 10A and 10B may have the same TFT structure. Alternatively, the first thin film transistor 10A may have a bottom gate structure while the second thin film transistor 10B may have a top gate structure.

The second insulating layer 16, which is the gate insulating film of the second thin film transistor 10B, may be allowed to extend to the region where the first thin film transistor 10A is formed, so as to function as an interlayer insulating film covering the gate electrode 15A and the crystalline silicon semiconductor layer 13 of the first thin film transistor 10A. When the interlayer insulating film of the first thin film transistor 10A and the gate insulating film of the second thin film transistor 10B are thus formed in the same layer (second insulating layer) 16, the second insulating layer 16 may have a multilayer structure which includes a hydrogen donor layer 16a capable of supplying hydrogen and an oxygen donor layer 16b capable of supplying oxygen, for example. In the example shown in the figure, the second insulating layer 16 has a two-layer structure with a lower layer defined by a hydrogen donor layer 16a and an upper layer defined by an oxygen donor layer 16b. The following advantages are obtained when the second insulating layer 16 thus has a multilayer structure including the hydrogen donor layer 16a and the oxygen donor layer 16b, such that the oxygen donor layer 16b is disposed closer to the crystalline oxide semiconductor layer 17 than is the hydrogen donor layer 16a.

In a heat treatment which will be described later, crystal defects occurring in the crystalline silicon semiconductor layer 13 can be reduced by supplying hydrogen from the hydrogen donor layer 16a to the crystalline silicon semiconductor layer 13. Moreover, oxygen defects occurring in the crystalline oxide semiconductor layer 17 can also be reduced because oxygen is supplied from the oxygen donor layer 16b to the crystalline oxide semiconductor layer 17. As a result, deteriorations in the crystalline silicon semiconductor layer 13 and the crystalline oxide semiconductor layer 17 to become the active layers of the respective thin film transistors 10A and 10B can be suppressed, thereby improving the thin film transistors 10A and 10B in reliability. Moreover, when the oxygen donor layer 16b is disposed in contact with the crystalline oxide semiconductor layer 17, oxygen defects in the crystalline oxide semiconductor layer 17 can be reduced more effectively.

The hydrogen donor layer 16a may be a silicon nitride (SiNx) layer that mainly contains silicon nitride, a silicon nitride oxide (SiNxOy: x>y) layer, or the like, for example. The oxygen donor layer 16b may be a silicon oxide (SiOx) layer that mainly contains silicon oxide, a silicon oxide nitride (SiOxNy: x>y) layer, or the like, for example. When an SiOx layer is used as the oxygen donor layer 16b, a good channel interface can be formed at its interface with the crystalline oxide semiconductor layer 17, whereby the reliability of the second thin film transistor 10B can be further improved.

Note that the multilayer-structured insulating layer may be an insulating layer that is used in common for the thin film transistors 10A and 10B, which does not need to include the gate insulating film of the second thin film transistor 10B and the interlayer insulating film of the first thin film transistor 10A. For example, regardless of the TFT structures of the thin film transistors 10A and 10B, in the case where the crystalline silicon semiconductor layer 13 and the crystalline oxide semiconductor layer 17 are provided in separate layers with an insulating layer being interposed between these layers, effects similar to the above will be obtained so long as the interposed insulating layer has a multilayer structure including a hydrogen donor layer and an oxygen donor layer which is located closer to the crystalline oxide semiconductor layer 17 than is the hydrogen donor layer. For example, the crystalline silicon semiconductor layer 13 may be disposed so as to be above the crystalline oxide semiconductor layer 17, in which case the oxygen donor layer may be disposed below the hydrogen donor layer in the interposed insulating layer. Note that the interposed insulating layer may be disposed so as to overlap the crystalline silicon semiconductor layer 13 and the crystalline oxide semiconductor layer 17 when viewed from the normal direction of the substrate 11, whereby deteriorations in the crystalline silicon semiconductor layer 13 and the crystalline oxide semiconductor layer 17 can be suppressed more effectively.

The gate electrode 15A of the first thin film transistor 10A and the gate electrode 15B of the second thin film transistor 10B may be formed in the same layer. Moreover, the source and drain electrodes 18sA and 18dA of the first thin film transistor 10A and the source and drain electrodes 18sB and 18dB of the second thin film transistor 10B may be formed in the same layer. Being "formed in the same layer" means being formed by using the same film (conductive film). As a result, increase in the number of production steps and the production cost can be suppressed.

The crystalline oxide semiconductor layer 17 in the present embodiment contains a semiconductor of an In—Ga—Zn—O type (hereinafter referred to as an "In—Ga—Zn—O type semiconductor"), for example. Herein, the In—Ga—Zn—O type semiconductor is a ternary oxide of In (indium), Ga (gallium), and Zn (zinc). The ratio between In, Ga, and Zn (composition ratio) is not particularly limited, and includes In:Ga:Zn=2:2:1, In:Ga:Zn=1:1:1, In:Ga:Zn=1:1:2, and the like, for example. Although there is no particular limitation as to the crystal structure of the In—Ga—Zn—O type semiconductor, a crystalline In—Ga—Zn—O type semiconductor whose c axis is oriented essentially perpendicular to the layer plane is preferable. The crystal structure of such an In—Ga—Zn—O type semiconductor is disclosed in Japanese Laid-Open Patent Publication No. 2012-134475, for example. The entire disclosure of Japanese Laid-Open Patent Publication No. 2012-134475 is incorporated herein by reference.

The crystalline oxide semiconductor layer 17 may contain other oxide semiconductors instead of an In—Ga—Zn—O type semiconductor. It may contain, for example, a Zn—O type semiconductor (ZnO), an In—Zn—O type semiconductor (IZO (registered trademark)), a Zn—Ti—O type semiconductor (ZTO), a Cd—Ge—O type semiconductor, a Cd—Pb—O type semiconductor, CdO (cadmium oxide), an Mg—Zn—O type semiconductor, an In—Sn—Zn—O type semiconductor (e.g., $In_2O_3$—$SnO_2$—ZnO), an In—Ga—Sn—O type semiconductor, or the like.

Next, a more specific construction of the semiconductor device of the present embodiment will be described, by taking an active matrix substrate for use in a display device as an example.

Figure 2:
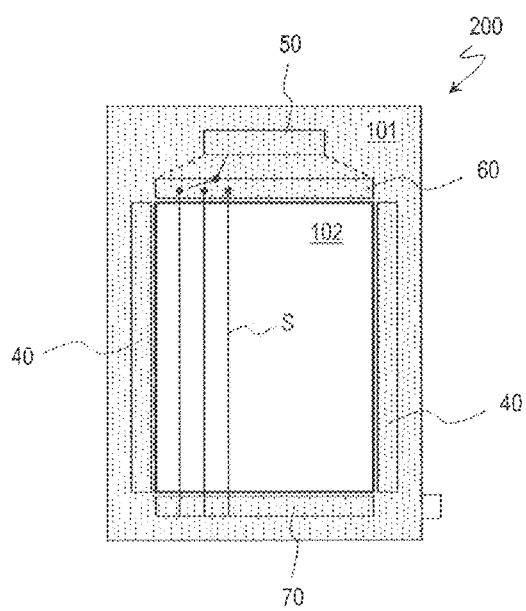
FIG. 2 A schematic plan view illustrating a semiconductor device (active matrix substrate) 200 according to the first embodiment of the present invention.
Figure 3:
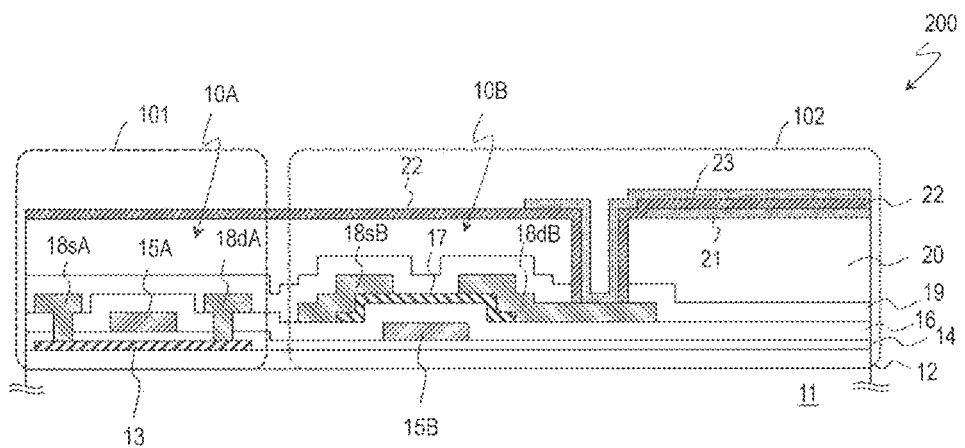
FIG. 3 A schematic cross-sectional view illustrating the semiconductor device (active matrix substrate) 200 according to the first embodiment of the present invention.

FIG. 2 is a schematic plan view showing an example of an active matrix substrate 200 according to the present embodiment. FIG. 3 is a cross-sectional view of a first thin film transistor 10A and a second thin film transistor 10B in the active matrix substrate 200. In FIG. 3, like numerals are given to constituent elements similar to those in FIG. 1, with their description being omitted.

As shown in FIG. 2, the active matrix substrate 200 has a display region 102 including a plurality of pixels and a region (non-display region) other than the display region 102. The non-display region includes a driving circuit forming region 101 in which driving circuitry is provided. In the driving circuit forming region 101, gate driver circuits 40, a check circuit 70, a source shared driving (SSD) circuit 60, and the like are provided, for example. In the display region 102, a plurality of gate bus lines (not shown) extending along the row direction and a plurality of source bus lines S extending along the column direction are formed. Although not shown, each pixel is defined by a gate bus line and a source bus line S, for example. The gate bus lines are respectively connected to the terminals of the gate driver circuits. The source bus lines S are respectively connected to the terminals of the driver IC 50 via the SSD circuit 60. The SSD circuit 60 assigns video data from one video signal line from each terminal of the driver IC 50 to plural (i.e., three herein) source bus lines S.

As shown in FIG. 3, a second thin film transistor 10B is formed as a pixel TFT for each pixel in the display region 102, whereas first thin film transistors 10A are formed as circuit TFTs in the driving circuit forming region 101.

In this example, the thin film transistors 10A and 10B are formed on an underlying film 12, which is formed on the surface of the substrate 11. The construction of the thin film transistors 10A and 10B is similar to the construction described above with reference to FIG. 1. The thin film transistors 10A and 10B are covered by a passivation film 19 and a planarization film 20. In each second thin film transistor 10B functioning as a pixel TFT, the gate electrode 15B is connected to a gate bus line (not shown), the source electrode 18sB is connected to a source bus line (not shown), and the drain electrode 18dB is connected to the pixel electrode 23. In this example, the drain electrode 18dB is connected to the corresponding pixel electrode 23 within an opening which is formed in the passivation film 19 and the planarization film 20. A video signal is supplied to the source electrode 18sB via the source bus line, and a necessary charge is written to the pixel electrode 23 based on a gate signal from the gate bus line.

As shown in the figure, a transparent conductive layer 21 may be formed as a common electrode on the planarization film 20, and a third insulating layer 22 may be formed between the transparent conductive layer (common electrode) 21 and the pixel electrodes 23. In this case, the pixel electrodes 23 may have slit apertures. The active matrix substrate 200 as such may be applicable to a display device of an FFS (Fringe Field Switching) mode, for example. An FFS mode is a mode under the lateral field method, in which a pair of electrodes are provided on one substrate and an electric field is applied to liquid crystal molecules in a direction (lateral direction) that is parallel to the substrate plane. In this example, an electric field is created as represented by electric lines of force which go out from the pixel electrode 23, pass through the liquid crystal layer (not shown), and further through the slit apertures in the pixel electrode 23 to emerge on the common electrode 21. This electric field includes a component in a lateral direction to the liquid crystal layer. As a result, an electric field in the lateral direction can be applied to the liquid crystal layer. In the lateral field method, liquid crystal molecules do not erect from the substrate, thus providing an advantage of being able to provide a wider viewing angle than in the vertical field method. Moreover, the active matrix substrate 200 is also applicable to a display device of a VA (Vertical Alignment) mode. In this case, the transparent conductive layer 21 may be formed as storage capacitor electrodes on the planarization film 20, thus allowing transparent storage capacitors to be constituted by the transparent conductive layer (storage capacitor electrodes) 21, the third insulating layer 22, and the pixel electrodes 23. This eliminates the need to provide storage capacitor lines by using a metal film, whereby the aperture ratio can be enhanced.

The active matrix substrate 200 of the present embodiment provides the following advantages. The OFF-leakage current of a second thin film transistor 10B, which is a crystalline oxide semiconductor TFT, is as small as e.g. (1/1000) of that of a polycrystalline silicon TFT. Therefore, by allowing the second thin film transistors 10B to function as the pixel TFTs in the display region 102, power consumption can be reduced. Moreover, the crystalline oxide semiconductor layer 17 can be connected to the source electrodes 18sB and the drain electrodes 18dB without making its way through any contact holes. Therefore, as compared to the case where crystalline silicon TFTs are used as the pixel TFTs, for example, the area for the contact hole portions can be spared, whereby the aperture ratio can be enhanced. Thus, a high-resolution display region 102 can be realized. Furthermore, since a crystalline oxide semiconductor has a higher mobility (e.g., 2 to 3 times higher) than does an amorphous oxide semiconductor, the device area can be made smaller than in the case where amorphous oxide semiconductor TFTs are used as the pixel TFTs. Therefore, even when the display is arranged to have a high resolution, the pixel TFTs can be made smaller, so that the amount of backlight transmitted per pixel can be increased.

On the other hand, using the first thin film transistors 10A as the circuit TFTs composing the circuits in the driving circuit forming region 101 allows the gate driver circuits 40 and the check circuit 70 to be reduced as compared to the case of using oxide semiconductor TFTs or amorphous silicon TFTs. The reason is that a crystalline silicon has a higher mobility than does an oxide semiconductor, an amorphous silicon, or the like. Moreover, using the first thin film transistors 10 allows for incorporation of the SSD circuit 60.

Now, the effects of allocating two types of thin film transistors 10A and 10B in the present embodiment will be described in comparison to an active matrix substrate 2000 according to Reference Example, in which amorphous oxide semiconductor TFTs alone are used.

Figure 4:
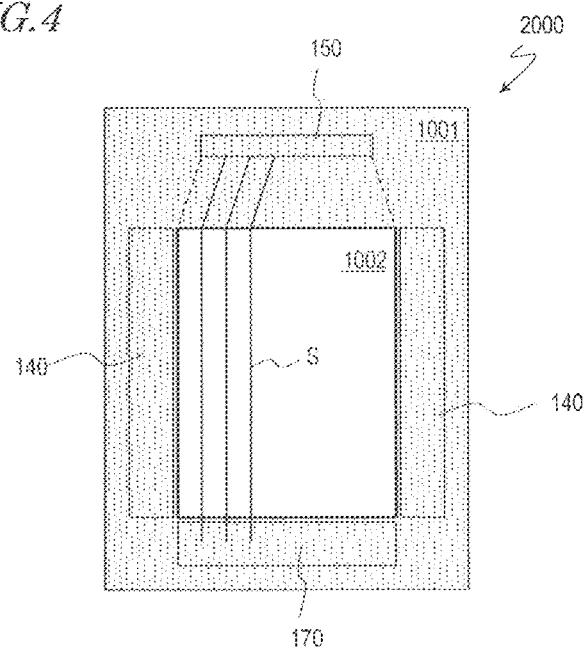
FIG. 4 A plan view illustrating an active matrix substrate 2000 according to Reference Example, which only incorporates amorphous oxide semiconductor TFTs.

The active matrix substrate 2000 shown in FIG. 4 includes a driving circuit forming region 1001 in which driver circuits 140 and a check circuit 170 are formed, and a display region 1002 having a plurality of pixels. Amorphous oxide semiconductor TFTs are used as the pixel TFTs and also as the circuit TFTs composing the driver circuits 140 and the check circuit 170.

In the active matrix substrate 2000 of Reference Example, amorphous oxide semiconductor TFTs are used to compose driving circuitry. Since an amorphous oxide semiconductor has a lower mobility than does a crystalline silicon, the device area must be increased in order to ensure the necessary current for the driving circuitry. In contrast, using crystalline silicon TFTs as the circuit TFTs as shown in FIG. 2 allows the gate driver circuits 40 and the check circuit 70 to be reduced, and the area of the frame region (non-display region) reduced, as compared to Reference Example illustrated in FIG. 4.

No SSD circuit is incorporated in Reference Example as illustrated in FIG. 4. This is because it is difficult to form an SSD circuit with amorphous oxide semiconductors whose mobility is small. On the other hand, the active matrix substrate 200 shown in FIG. 2 includes the SSD circuit 60, in which first thin film transistors 10A are used as the crystalline silicon TFTs. Providing the SSD circuit 60 helps the driver IC 50 become smaller. Moreover, since the number of video signal lines from the driver IC 50 can be reduced (to ⅓ herein), the area which is required for the wiring lines between the driver IC 50 and the display region 102 can be reduced. Therefore, by providing the SSD circuit 60 through the use of crystalline silicon TFTs, the driving circuit forming region 101 of the active matrix substrate 200 can be reduced more effectively, and the frame area can be reduced.

Note that, when conventional amorphous oxide semiconductor TFTs are used as the pixel TFTs, the less-than-sufficient mobility of the amorphous oxide semiconductor makes it difficult to supply predetermined charges to the pixels in short periods of time. Therefore, if an SSD circuit were to be provided and the write time be shortened, it might not be possible to better charge each pixel. On the other hand, when crystalline oxide semiconductor TFTs are used as the pixel TFTs as in the present embodiment, the time required for charging each pixel can be reduced because a crystalline oxide semiconductor has a higher mobility than does an amorphous oxide semiconductor. Therefore, even if an SSD circuit is provided to shorten the write time to e.g. ⅓, each pixel can be surely charged.

The driver circuits 140 includes a shift register circuit, for example. The shift register circuit inputs shifted pulses to plural gate bus lines, and sequentially turns ON the pixel TFTs that are connected to the gate bus lines.

Figure 11:
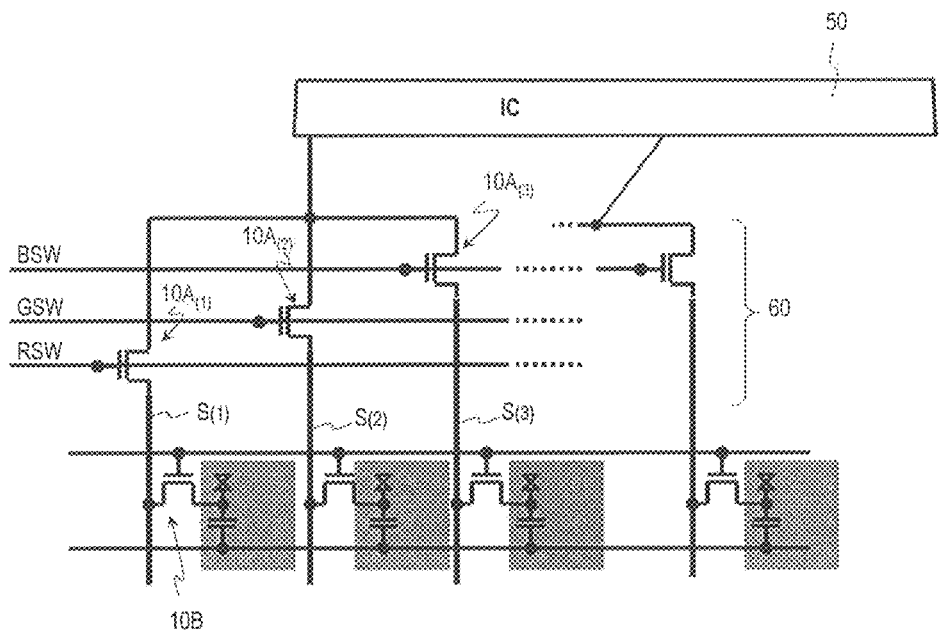
FIG. 11 A diagram for describing a construction for an SSD circuit according to the first embodiment.

The SSD circuit 60 includes, as shown in FIG. 11, switching control signal lines BSW, GSW and RSW and a plurality of first thin film transistors $10A_{(1)}$ to $10A_{(3)}$, for example. The gate electrodes of the first thin film transistors $10A_{(1)}$ to $10A_{(3)}$ are respectively connected to the switching control signal lines BSW, GSW and RSW. The source electrodes of the first thin film transistors $10A_{(1)}$ to $10A_{(3)}$ are connected to video signal lines of the driver IC 50, and the drain electrodes are connected to the corresponding source bus lines $S_{(1)}$ to $S_{(3)}$.

Figure 12:
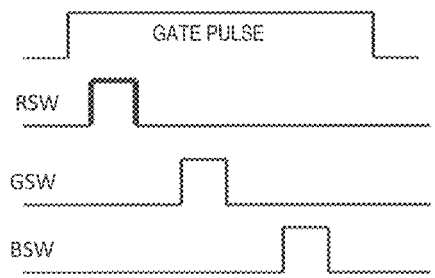
FIG. 12 A diagram illustrating a signal waveform to be input to a gate bus line and signal waveforms to be input to respective switching control signal lines.

FIG. 12 is a diagram illustrating a signal waveform to be input to a gate bus line and signal waveforms to be input to respective switching control signal lines. As shown in FIG. 12, the switching control signal lines BSW, GSW and RSW sequentially go High during a period in which the gate pulse is High. As a result, the first thin film transistors $10A_{(1)}$ to $10A_{(3)}$ are sequentially turned ON, thus allowing video data to be assigned to the source bus lines $S_{(1)}$ to $S_{(3)}$.

The active matrix substrate 200 of the present embodiment reconciles a high resolution, low power consumption, and a narrow frame, thereby realizing a display device that is better balanced at a highly sophisticated level than is a conventional active matrix substrate in which polycrystalline silicon TFTs alone are used (referred to as a "p-Si substrate"). The reasons will be described below.

In a polycrystalline silicon TFT, usually, the polycrystalline silicon semiconductor layer is connected to source and drain electrodes within contact holes which are formed in an interlayer insulating film. On the other hand, in a second thin film transistor 10B which is a crystalline oxide semiconductor TFT, the crystalline oxide semiconductor layer 17 is able to connect to the source electrode 18sB and the drain electrode 18dB without making its way through any contact holes. Therefore, when such second thin film transistors 10B are used as the pixel TFTs, the area for the contact hole portions can be spared, whereby a higher resolution can be attained and the aperture ratio can be enhanced, as compared to a p-Si substrate in which crystalline silicon TFTs are used as the pixel TFTs. It has been confirmed through a study by the inventors that the aperture ratio can be improved by e.g. 2% over a p-Si substrate.

Moreover, since crystalline silicon TFTs are used as the circuit TFTs in the driving circuit forming region 101 in a similar manner to a p-Si substrate, a narrow frame which may be similar to that of a conventional p-Si substrate can be realized.

Furthermore, using second thin film transistors 10B as the pixel TFTs achieves low-frequency driving. A study by the inventors has found that, according to the present embodiment, power consumption can be reduced by 45% over a p-Si substrate (60 Hz driving) when 30 Hz driving and 1 Hz driving are performed based on a time distribution of 1:4 (a mixed mode of 30 Hz:1 Hz=1:4), for example.

Next, a method of producing the active matrix substrate 200 according to the present embodiment will be described.

Figure 5:
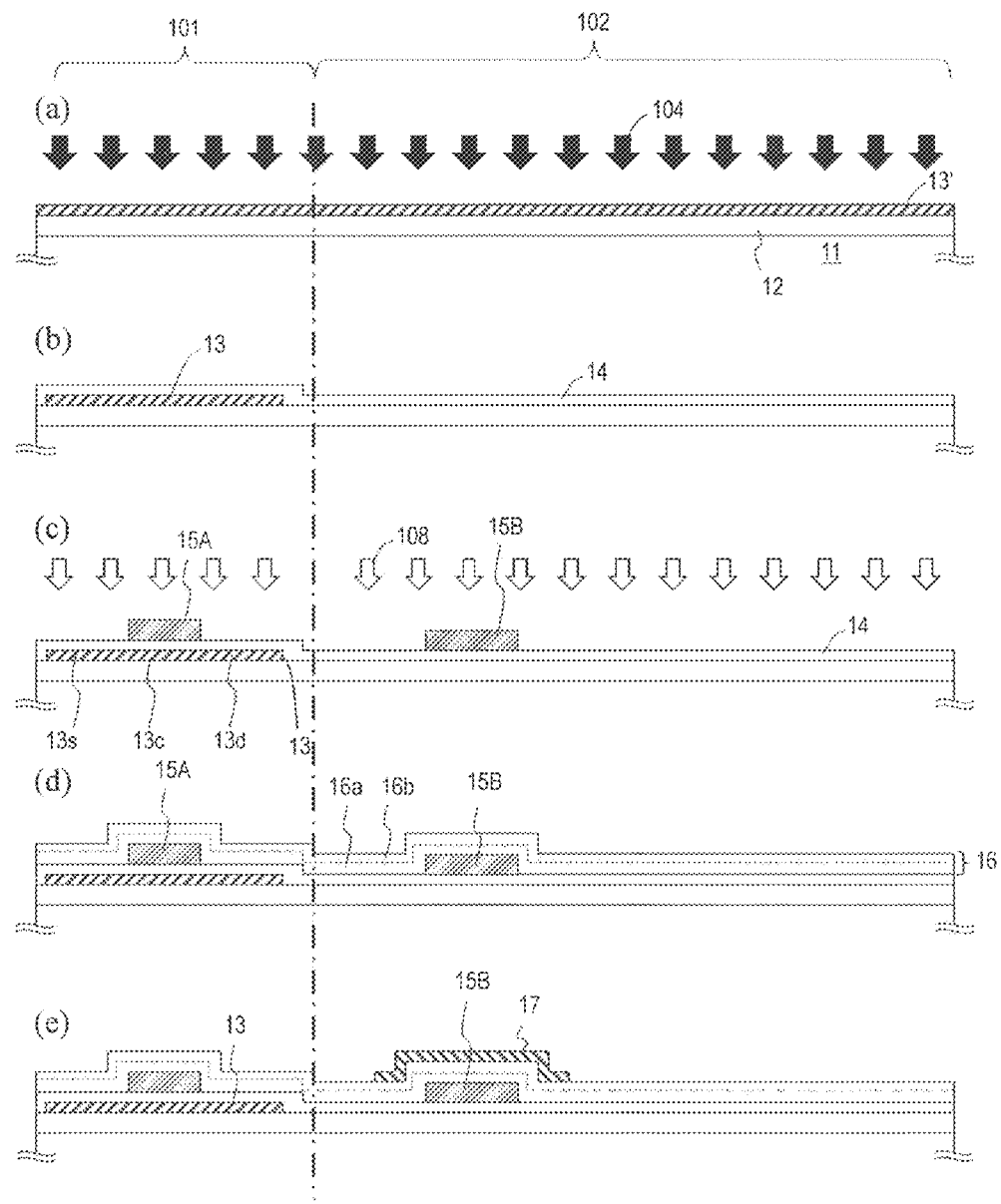
FIG. 5 (a) to (e) are schematic step-by-step cross-sectional views each describing a production step for the active matrix substrate 200 according to the first embodiment.
Figure 6:
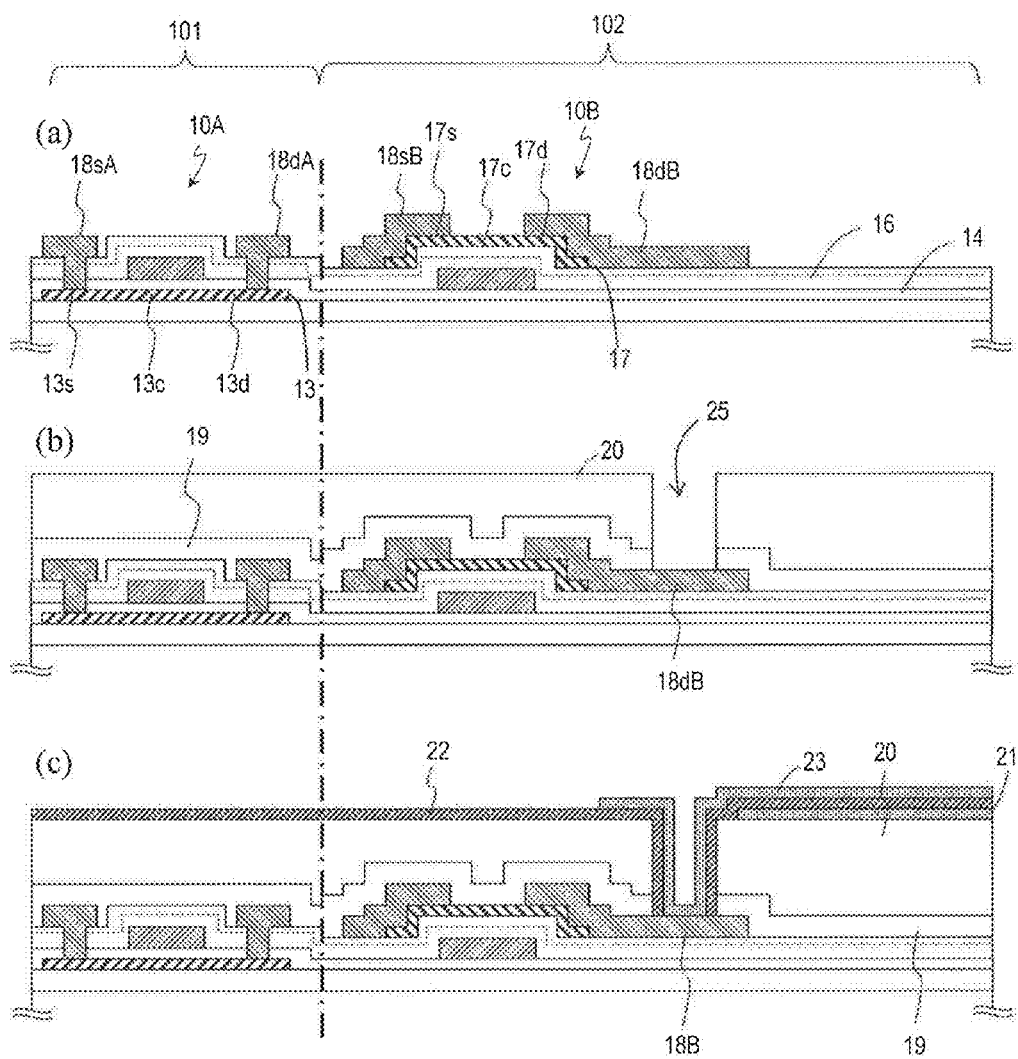
FIG. 6 (a) to (c) are schematic step-by-step cross-sectional views each describing a production step for the active matrix substrate 200 according to the first embodiment.

FIG. 5 and FIG. 6 are step-by-step cross-sectional views for describing an exemplary method of producing the active matrix substrate 200.

First, on a substrate 11, an underlying film 12 is formed, upon which a crystalline silicon film (which herein is a polysilicon (p-Si) film) 13' is formed. As the substrate 11, various substrates can be used, e.g., a glass substrate, a resin plate, or a resin film. As the underlying film 12, although not particularly limited, a multilayer film including a lower layer of a silicon nitride (SiNx) film and an upper layer of a silicon oxide (SiOx) film may be formed, for example. The p-Si film 13' can be formed by forming an amorphous silicon (a-Si) film and allowing it to crystallize. Formation of the a-Si film can be achieved by a known method, such as a plasma CVD (Chemical Vapor Deposition) technique or a sputtering technique. Crystallization of the a-Si film may be achieved by irradiating an a-Si film with excimer laser light 104, for example.

Next, as shown in FIG. 5(*b*), the p-Si film 13' is patterned to form a crystalline silicon semiconductor layer (thickness: e.g. not less than 30 nm and not more than 70 nm) 13 in island shapes on the driving circuit forming region 101. Thereafter, a first insulating layer (thickness: e.g. not less than 50 nm and not more than 130 nm) 14 is formed so as to cover the crystalline silicon semiconductor layer 13. Although there is no particular limitation, the first insulating layer 14 mainly contains silicon oxide (SiOx), for example. The first insulating layer 14 is to become a gate insulating film of the first thin film transistors 10A. Herein, the first insulating layer 14 is allowed to extend also to the display region 102.

Next, as shown in FIG. 5(*c*), after an electrode film for the gates (thickness: not less than 200 nm and not more than 500 nm) is formed, it is patterned. This results in gate electrodes 15A for the first thin film transistors 10A, gate electrodes 15B for the second thin film transistors 10B, gate lines (not shown), and the like. As the material for the electrode film for the gates, without particular limitation, a film containing a metal such as aluminum (Al), tungsten (W), molybdenum (Mo), tantalum (Ta), chromium (Cr), titanium (Ti), or copper (Cu), or an alloy thereof, may be used as appropriate. Moreover, a multilayer film obtained by stacking a plurality of these films may be used. Without particular limitation, any known photolithography and dry etching may be used as the patterning method.

Thereafter, by using the gate electrodes 15A as a mask, an impurity 108 is implanted to the crystalline silicon semiconductor layer 13, thereby forming source regions 13s and drain regions 13d. Regions of the crystalline silicon semiconductor layer 13 where the impurity has not been implanted define active regions (channel regions) 13c.

Next, as shown in FIG. 5(*d*), a second insulating layer (thickness: e.g. not less than 180 nm and not more than 550 nm) 16 covering the first insulating layer 14 and the gate electrodes 15A and 15B is formed. Herein, as the second insulating layer 16, a multilayer film with a lower layer of a hydrogen donor layer 16a and an upper layer of an oxygen donor layer 16b is formed. As the hydrogen donor layer 16a, for example, a silicon nitride (SiNx) layer (thickness: e.g. not less than 150 nm and not more than 450 nm) may be used. The silicon nitride layer may be formed by a CVD technique, under conditions that are conducive to the composition $Si_3N_4$, for example. As the oxygen donor layer 16b, for example, a silicon oxide (SiOx) layer (thickness: e.g. not less than 30 nm and not more than 100 nm) may be used. The silicon oxide layer may be formed by a CVD technique, under conditions that are conducive to the composition $SiO_2$, for example. The second insulating layer 16 includes portions to function as an interlayer insulating film of the first thin film transistors 10A and portions to function as a gate insulating film of the second thin film transistors 10B. The hydrogen donor layer 16a is effective for replacing unpaired bonds occurring in the crystalline silicon semiconductor layer 13 with hydrogen. The oxygen donor layer 16b will make it possible, when oxygen defects occur in the crystalline oxide semiconductor layer 17, to remedy the oxygen defects with the oxygen that is contained in the oxygen donor layer 16b, thus preventing lowered resistance associated with the oxygen defects in the crystalline oxide semiconductor layer 17. Moreover, since an SiOx layer is suitable for forming channel interfaces with the crystalline oxide semiconductor layer 17, good channel interfaces may be obtained by using an SiOx layer as the oxygen donor layer 16b, the SiOx layer being disposed in contact with the active regions 17c in the crystalline oxide semiconductor layer 17. Moreover, the second insulating layer 16 may have a multilayer structure of three or more layers, so long as it includes the hydrogen donor layer 16a and the oxygen donor layer 16b, the oxygen donor layer 16b being closer to the crystalline oxide semiconductor layer 17 than is the hydrogen donor layer 16a.

Next, as shown in FIG. 5(e), the crystalline oxide semiconductor layer 17 is formed in the display region 102. Specifically, first, an amorphous oxide semiconductor film is formed on the second insulating layer 16 by sputtering technique, for example. Herein, as the amorphous oxide semiconductor film, an In—Ga—Zn—O type amorphous semiconductor film is used, for example. The amorphous oxide semiconductor film has a thickness of e.g. not less than 40 nm and not more than 120 nm. Thereafter, the amorphous oxide semiconductor film is patterned to give an amorphous oxide semiconductor layer in island shapes. In this state, a heat treatment is performed at a temperature of e.g. not less than 350° C. and not more than 550° C., and preferably not less than 400° C. and not more than 500° C. This heat treatment may be conducted in a nitrogen ambient, a nitrogen-oxygen mixed ambient, an oxygen ambient or the like, for example. In order to avoid reduction reaction of the oxide semiconductor, a hydrogen ambient is not preferable, while an inert gas or an oxidizing ambient is preferable. Thus, the amorphous oxide semiconductor layer is crystallized to give the crystalline oxide semiconductor layer (which herein is a crystalline In—Ga—Zn—O type semiconductor layer) 17. Together with this, hydrogen is supplied from the second insulating layer 16 (which mainly is a hydrogen donor layer 16a) to the crystalline silicon semiconductor layer 13, whereby at least some of the silicon unpaired bonds within the crystalline silicon semiconductor layer 13 become terminated with hydrogen. Note that the heat treatment for crystallization and hydrogen termination purposes may be performed before patterning the amorphous oxide semiconductor film.

Next, as shown in FIG. 6(a), contact holes are formed in the first insulating layer 14 and the second insulating layer 16 so as to reach the source regions 13s and drain regions 13d in the crystalline silicon semiconductor layer 13.

Thereafter, source and drain electrodes 18sA, 18dA, 18sB and 18dB of the first thin film transistors 10A and the second thin film transistors 10B are formed. Specifically, first, an electrode film for the sources is formed in the contact holes and on the second insulating layer 16 and the crystalline oxide semiconductor layer 17 by sputtering technique, for example. Then, the electrode film for the sources is patterned. As a result, source electrodes 18sA and drain electrodes 18dA that are in contact with the source regions 13s and drain regions 13d of the crystalline silicon semiconductor layer 13, source electrodes 18sB and drain electrodes 18dB that are in contact with the surface of the crystalline oxide semiconductor layer 17, and source bus lines (not shown) are formed. The portions of the crystalline oxide semiconductor layer 17 that are in contact with the source electrodes 18sB and the drain electrodes 18dB respectively become source contact regions 17s and drain contact regions 17d. Any portion of the crystalline oxide semiconductor layer 17 that overlaps a gate electrode 15B (via the second insulating layer 16) and is located between a source contact region 17s and a drain contact region 17d becomes an active region 17c. The electrode film for the sources may be an aluminum film, for example. Alternatively, it may be a multilayer film including a barrier metal film(s) (e.g., a Ti film(s), an Mo film(s), or the like) as an upper layer and/or a lower layer of an aluminum film. There is no particular limitation as to the material of the electrode film for the sources. As the electrode film for the sources, a film containing a metal such as aluminum (Al), tungsten (W), molybdenum (Mo), tantalum (Ta), copper (Cu), chromium (Cr) or titanium (Ti), an alloy thereof, or a metal nitride thereof may be used as appropriate. Moreover, a multilayer film obtained by stacking a plurality of these films may be used. For example, a multilayer film obtained by stacking a Ti film, an Al film, and a Ti film in this order (Ti/Al/Ti) may be used. In this manner, the first thin film transistors 10A and the second thin film transistors 10B are fabricated.

Next, as shown in FIG. 6(b), a passivation film (thickness: e.g. not less than 150 nm and not more than 700 nm) 19 and a planarization film 20 are formed so as to cover the first thin film transistors 10A and the second thin film transistors 10B.

In this example, the passivation film 19 is formed so as to be in contact with the surface of the active region 17c of the crystalline oxide semiconductor layer 17. In the present embodiment, the lower layer is an SiOx film (thickness: e.g. not less than 100 nm and not more than 400 nm) and the upper layer is an SiNx film (thickness: e.g. not less than 50 nm and not more than 300 nm). In this case, it is preferable for the lower layer of the passivation film 19 to be an SiOx film because it constitutes back channels of the second thin film transistors 10B, and it is preferable for the upper layer to be an SiNx film, which provides a high passivation effect for protection from moisture and impurities. Note that the material of the passivation film 19 is not limited to the above, but SiON, SiNO, and the like may be used in combination. The planarization film 20 may be formed on the passivation film 19 by coating, for example. The planarization film 20 may be an organic insulating layer, and may be an insulating layer of an acrylic type transparent resin having a positive-type photosensitivity, for example.

Thereafter, by photolithography, apertures 25 through which to expose the drain electrodes 18dB of the second thin film transistors 10B are formed in the passivation film 19 and the planarization film 20.

Next, as shown in FIG. 6(c), a transparent common electrode 21 is formed on the planarization film 20. The common electrode 21 may be formed by using a transparent conductive film such as an ITO (indium tin oxide) film, an IZO film, or a ZnO film (zinc oxide film). The common electrode 21 may be formed in substantially the entire display region 102, except for regions located above the second thin film transistors 10B, for example.

Thereafter, a third insulating layer 22 is formed in the apertures 25 and on the planarization film 20 and the common electrode 21. Next, portions of the third insulating layer 22 that are located in the apertures 25 are at least partially removed to expose the drain electrodes 18dB. As the third insulating layer 22, a silicon oxide (SiOx) film, a silicon nitride (SiNx) film, a silicon oxide nitride (SiOxNy; x>y) film, a silicon nitride oxide (SiNxOy; x>y) film, or the like may be used as appropriate.

Then, pixel electrodes 23 are formed so as to be in contact with the drain electrodes 18dB in the apertures 25. The pixel electrodes 23 may be formed by using a transparent conductive film such as an ITO film, an IZO film, or a ZnO film. Although not shown, FFS mode or IPS mode display devices may also be supported by altering the planar pattern of the pixel electrodes 23, e.g., by making slit apertures in the pixel electrodes 23. In this manner, the active matrix substrate 200 according to the present embodiment is obtained.

Figure 7:
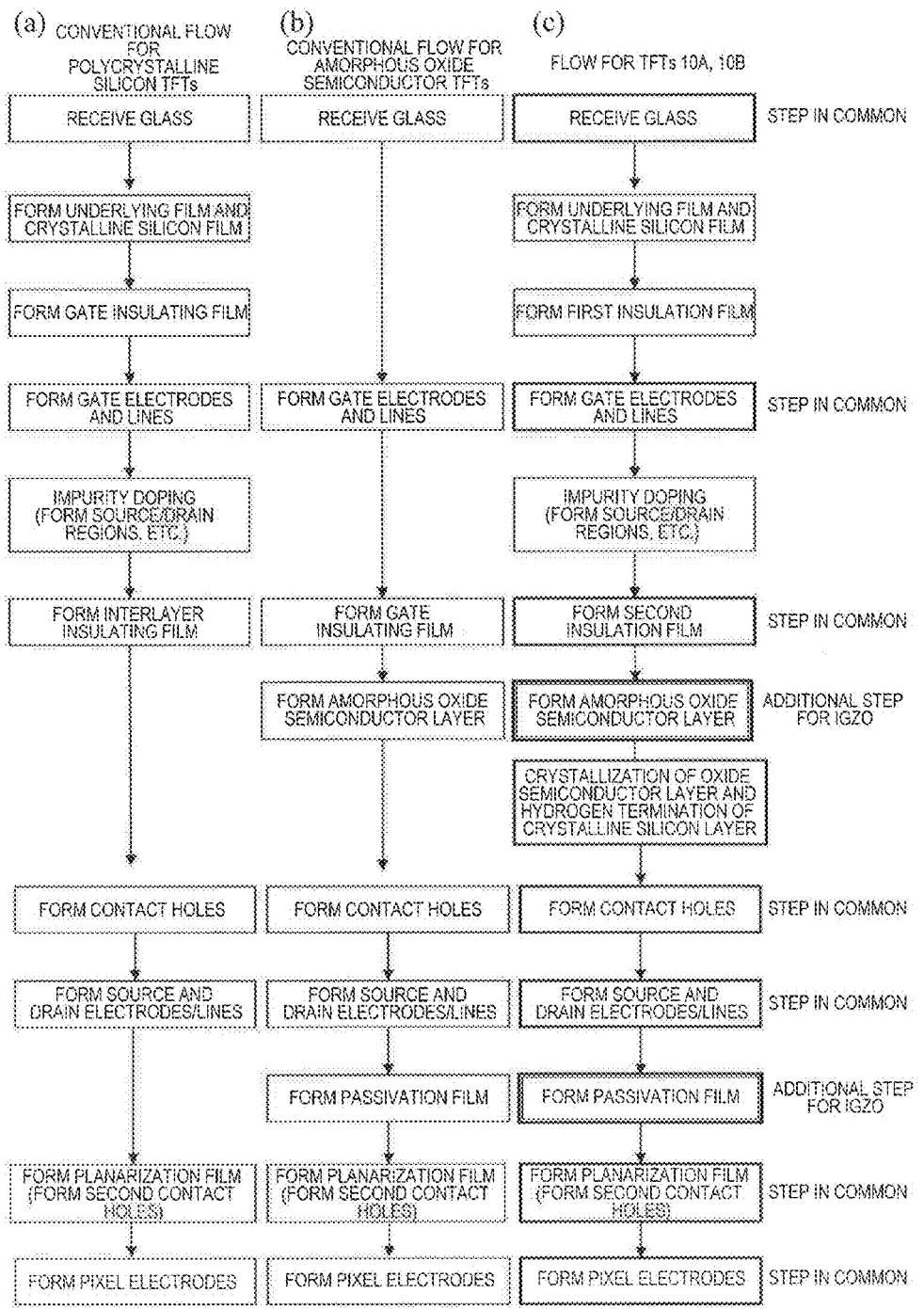
FIGS. 7 (a) and (b) are diagrams illustrating conventional production steps for polysilicon TFTs and amorphous oxide semiconductor TFTs, respectively; and (c) is a diagram illustrating production steps for first thin film transistors 10A and second thin film transistors 10B according to the first embodiment.

FIG. 7(a) is a diagram showing conventional production steps for polysilicon TFTs; FIG. 7(b) is a diagram showing conventional production steps for amorphous oxide semiconductor TFTs; and FIG. 7(c) is a diagram showing production steps in the above-described method as illustrated in FIG. 5 and FIG. 6. As can be seen from FIG. 7, according to the above method, when forming the first thin film transistors 10A and the second thin film transistors 10B in an integral manner on the substrate 11, the following steps can be performed as common steps: formation of the gate line layers of the first thin film transistors 10A and the second thin film transistors 10B; formation of the interlayer insulating film of the first thin film transistors 10A and the gate insulating film of the second thin film transistors 10B; formation of the source line layers of the first thin film transistors 10A and the second thin film transistors 10B; and so on. Furthermore, the step of crystallizing the amorphous oxide semiconductor layer and the step of terminating crystal defects in the crystalline silicon layer, e.g., polysilicon, with hydrogen can be carried out through the same heat treatment. Thus, increase in the number of production steps and the production cost can be suppressed.

In the present embodiment, each pixel electrode 23 is disposed so as to at least partially overlap the common electrode 21 via the third insulating layer 22 (sandwich structure). In such a structure, capacitors are created in portions where the pixel electrodes 23 and the common electrode 21 overlap via the third insulating layer 22. These capacitors function as storage capacitors. By appropriately adjusting the material and thickness of the third insulating layer 22 to become the dielectric layer in the storage capacitors, the area of the portions at which the capacitors are created, and the like, it becomes possible to obtain storage capacitors having desired capacitances. Therefore, there is no need to separately form storage capacitors within the pixels by using the same metal film as the source lines, and so on. Thus, decrease in the aperture ratio associated with forming storage capacitors by using a metal film is suppressed.

Figure 13:
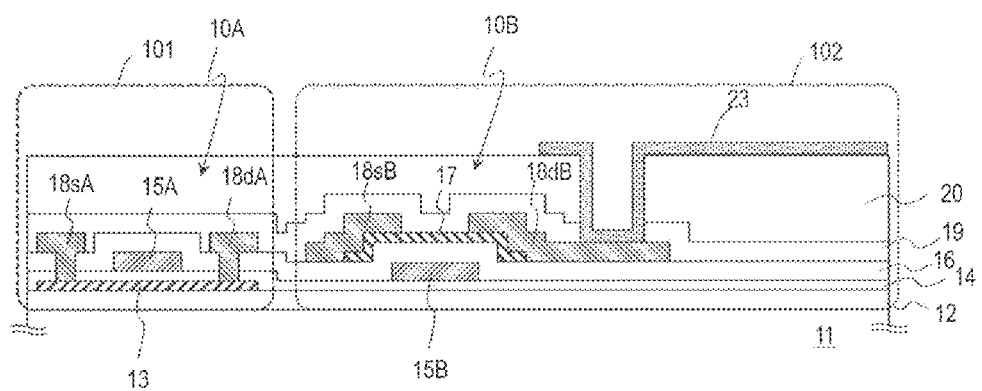
FIG. 13 A schematic cross-sectional view illustrating a semiconductor device (active matrix substrate) according to another embodiment of the present invention.

Note that the pixel electrode structure of the active matrix substrate 200 of the present embodiment is not limited to the above-described structure. The pixel electrodes may be disposed below the common electrode (i.e., closer to the substrate). Alternatively, as shown in FIG. 13, a single-layer structure including pixel electrodes alone may be adopted.

Second Embodiment

Hereinafter, a second embodiment of a semiconductor device according to the present invention will be described by taking an active matrix substrate of a display device as an example.

Figure 8:
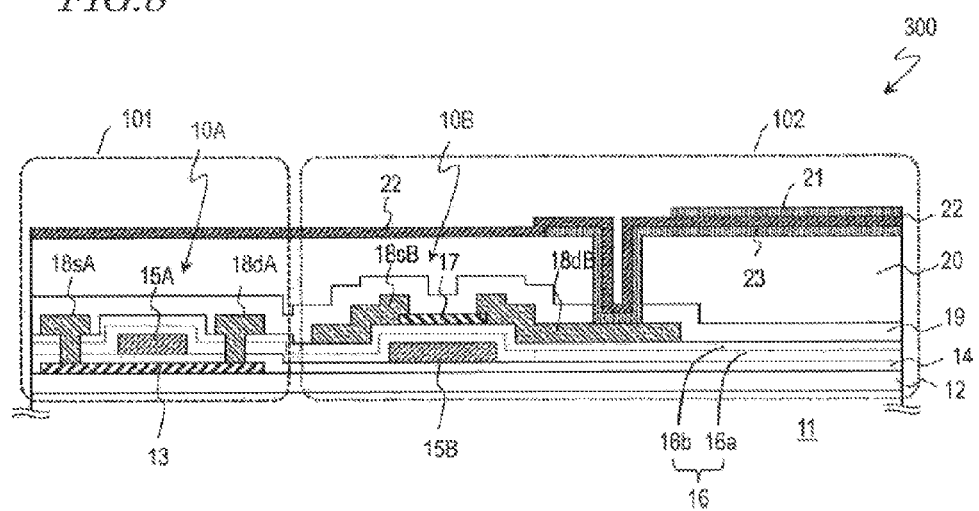
FIG. 8 A schematic cross-sectional view illustrating a semiconductor device (active matrix substrate) 300 according to a second embodiment of the present invention.

FIG. 8 is a cross-sectional view illustrating an active matrix substrate 300 according to the present embodiment. The active matrix substrate 300 includes first thin film transistors 10A which are crystalline silicon TFTs and second thin film transistors 10B which are crystalline oxide semiconductor TFTs. In the active matrix substrate 300, the pattern of the crystalline oxide semiconductor layer 17 of the second thin film transistors 10B is made smaller than that of the active matrix substrate 200 of the first embodiment shown in FIG. 3. Moreover, a pixel electrode structure which is different from the active matrix substrate 200 is adopted. Otherwise, the construction is similar to that of the active matrix substrate 200, and the description thereof will be omitted.

As shown in FIG. 8, in the present embodiment, the pattern of the crystalline oxide semiconductor layer 17 is set so that, when the substrate 11 is viewed from the normal direction, the crystalline oxide semiconductor layer 17 of each second thin film transistor 10B is entirely overlapped by a gate electrode (or a gate line) 15B. Therefore, the channel length of the crystalline oxide semiconductor layer 17 (i.e., its length along the channel direction) is smaller than the width of the gate electrode 15B along the channel direction. By making the crystalline oxide semiconductor layer 17 thus small, the area of each second thin film transistor 10B in the display region 102 can be further reduced, whereby the aperture ratio can be improved. Moreover, an even high resolution can be achieved.

When crystalline silicon TFTs are used for the driving circuit, it has a lower driving voltage than that of the driver IC. Since a lower driving voltage leads to less tolerance for characteristic deteriorations in the crystalline oxide semiconductor layer 17, even a small deterioration in the crystalline oxide semiconductor layer 17 may affect the displaying characteristics. On the other hand, when the entire rear face of the crystalline oxide semiconductor layer 17 is covered by the gate electrode 15B, as shown in FIG. 8, light from the backlight is better restrained from entering the crystalline oxide semiconductor layer 17 through the substrate 11. Thus, characteristic deteriorations in the crystalline oxide semiconductor layer can be more effectively suppressed, thereby making it possible to suppress degradation in the displaying characteristics due to characteristic deteriorations in the crystalline oxide semiconductor layer 17.

In the present embodiment, in the display region 102, the pixel electrodes 23, the third insulating layer 22, and the common electrode 21 are formed in this order on the planarization film 20. By thus disposing the pixel electrodes 23 below the common electrode 21 (i.e., closer to the substrate 11), it becomes possible to reduce the size of the contact portions between the pixel electrodes 23 and the drain electrodes 18dB, as compared to the pixel electrode structure of the first embodiment. In the first embodiment, in order to permit contact between the pixel electrodes 23 and the drain electrodes 18dB, apertures in the third insulating layer 22 need to be formed within the apertures 25 in the passivation film 19 and the planarization film 20. On the other hand, in the present embodiment, there is no need to form any other aperture within each aperture 25. Therefore, the size (contact hole diameter) of the apertures 25 can be reduced, whereby the second thin film transistors 10B can be reduced in size. As a result, transmittance within the pixel can be further enhanced, which is advantageous for attaining high resolutions. In the present embodiment as well as in the first embodiment, the pixel electrodes 23 and the common electrode 21 overlap via the third insulating layer 22 to create storage capacitors.

Figure 9:
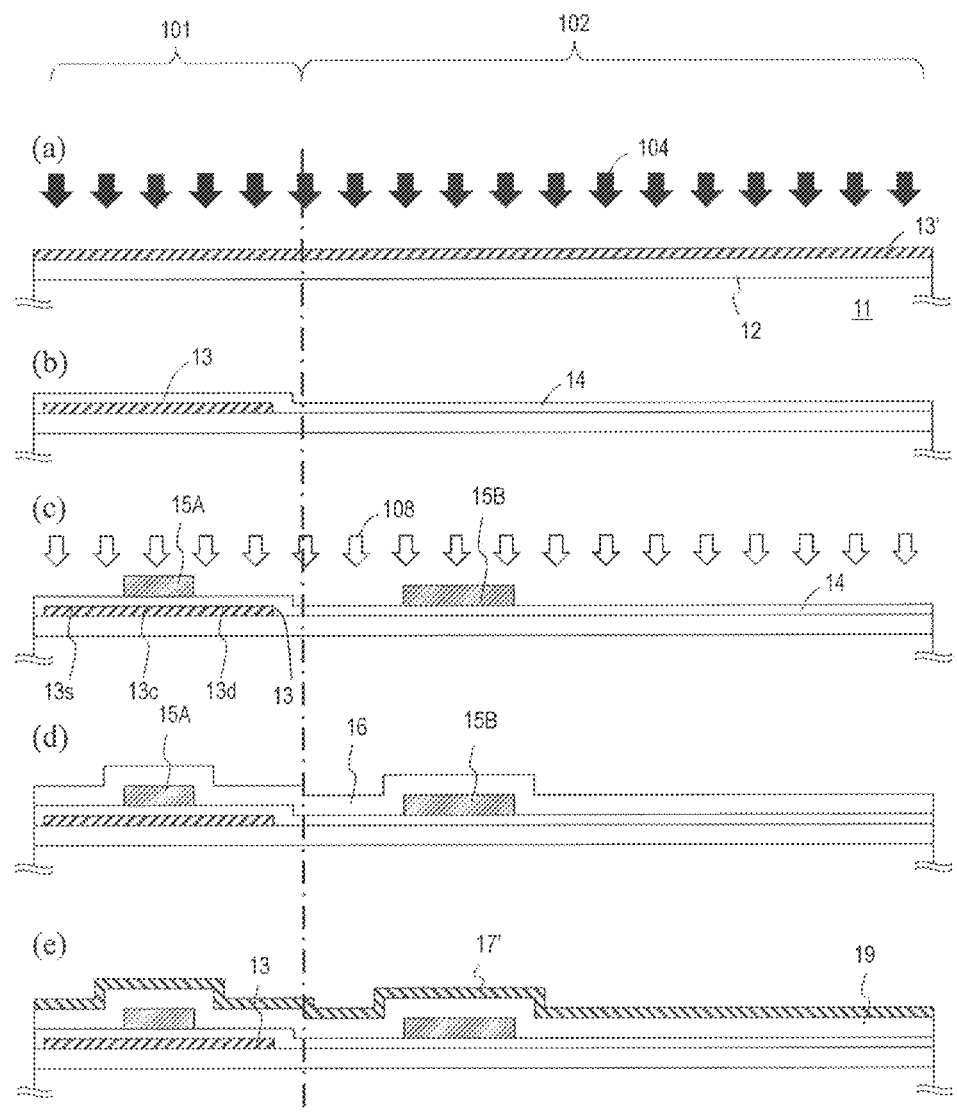
FIG. 9 (a) to (e) are schematic step-by-step cross-sectional views each describing a production step for the active matrix substrate 300 according to the second embodiment.
Figure 10:
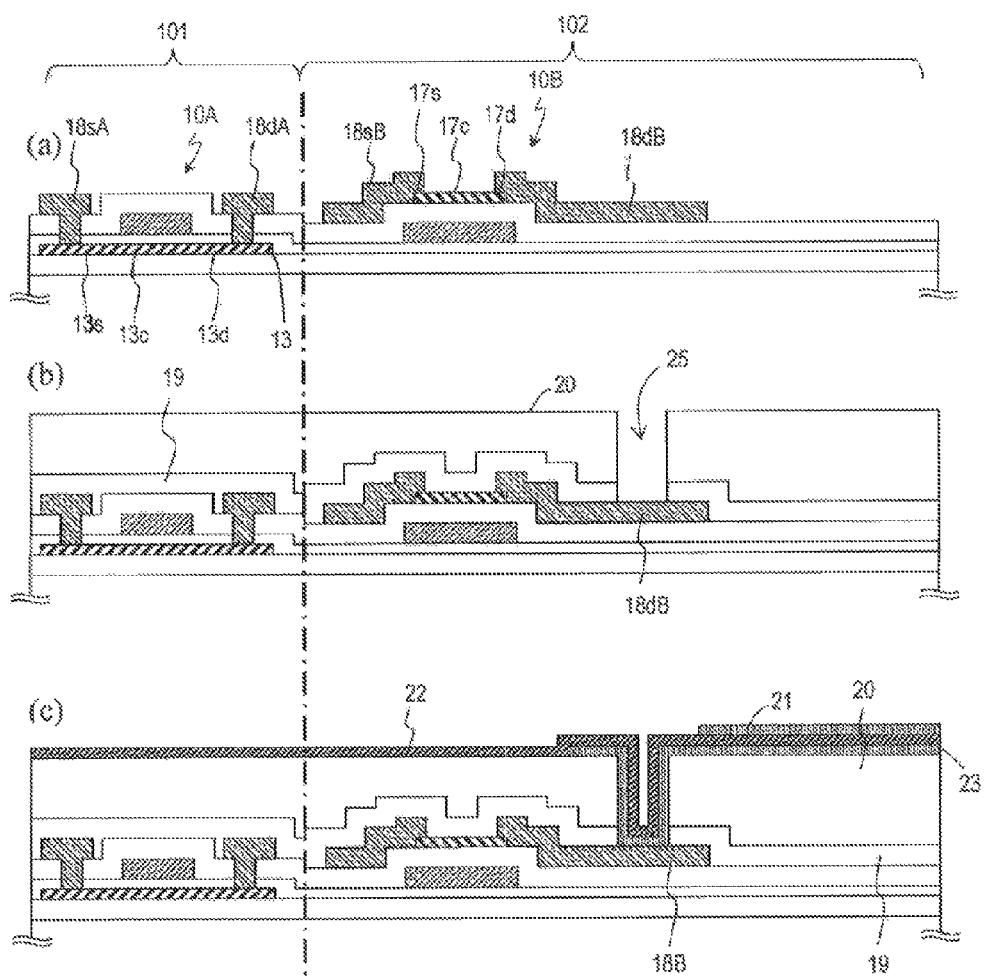
FIG. 10 (a) to (c) are schematic step-by-step cross-sectional views each describing a production step for the active matrix substrate 300 according to the second embodiment.

Next, with reference to the drawings, an exemplary method of producing the active matrix substrate 300 of the present embodiment will be described. FIG. 9 and FIG. 10 are step-by-step cross-sectional views for describing the method of producing the active matrix substrate 300.

First, as shown in FIG. 9(a) to FIG. 9(d), a crystalline silicon semiconductor layer 13, a first insulating layer 14, gate electrodes 15A and 15B, and a second insulating layer 16 are formed on a substrate 11. The materials, thicknesses, and formation methods of these layers are identical to the materials, thicknesses, and formation methods which have been described above with reference to FIG. 5(a) to FIG. 5(d).

Next, as shown in FIG. 9(e), a crystalline oxide semiconductor film 17' is formed on the second insulating layer 16. Specifically, first, an amorphous oxide semiconductor film is formed on the second insulating layer 16, and a heat treatment is conducted in this state. The heat treatment is performed under processing conditions such as: a temperature of e.g. not less than 350° C. and not more than 550° C., and preferably not less than 400° C. and not more than 500° C.; a nitrogen ambient, an oxygen ambient, or the like. As a result, the amorphous oxide semiconductor film is crystallized, whereby the crystalline oxide semiconductor film 17' is obtained. With this heat treatment, hydrogen is supplied from the second insulating layer 16 (which mainly is a hydrogen donor layer 16a) to the crystalline silicon semiconductor layer 13, whereby silicon unpaired bonds within the crystalline silicon semiconductor layer 13 become terminated with hydrogen.

Next, as shown in FIG. 10(a), the crystalline oxide semiconductor film 17' is patterned to give a crystalline oxide semiconductor layer 17. In the present embodiment, when viewed from the normal direction of the substrate 11, the crystalline oxide semiconductor film 17' is patterned so that the contour of the crystalline oxide semiconductor layer 17 fits inside the gate electrode 15B. As has been described in the first embodiment, after patterning the amorphous oxide semiconductor film, a heat treatment may be performed to form the crystalline oxide semiconductor layer 17.

Thereafter, contact holes are formed in the first insulating layer 14 and the second insulating layer 16 so as to reach the source regions 13s and drain regions 13d in the crystalline silicon semiconductor layer 13. Next, an electrode film for the sources is formed and patterned, whereby source electrodes 18sA and drain electrodes 18dA that are in contact with the source regions 13s and drain regions 13d of the crystalline silicon semiconductor layer 13, source electrodes 18sB and drain electrodes 18dB that are in contact with the surface of the crystalline oxide semiconductor layer 17, and source bus lines (not shown) are formed. Formation methods for the contact holes and the source and drain electrodes 18sA, 18dA, 18sB and 18dB are similar to the methods which have been described above with reference to FIG. 6(a).

Next, as shown in FIG. 10(b), a passivation film 19 and a planarization film 20 are formed so as to cover the first thin film transistors 10A and the second thin film transistors 10B. The materials, thicknesses, and formation methods of these films may be similar to the materials, thicknesses, and formation methods which have been described above with reference to FIG. 6(b). Thereafter, by photolithography, apertures 25 through which to expose the drain electrodes 18dB of the second thin film transistors 10B are formed in the passivation film 19 and the planarization film 20.

Next, as shown in FIG. 10(c), a pixel electrode structure including the pixel electrodes 23 is formed.

The pixel electrodes 23 are disposed on the planarization film 20 and in the apertures 25, so as to be in contact with the drain electrodes 18dB in the apertures 25. The pixel electrodes 23 may be formed by forming a transparent conductive film such as an ITO film, an IZO film, or a ZnO film, and patterning it.

Next, a third insulating layer 22 is formed on the planarization film 20 and the pixel electrodes 23. As the third insulating layer 22, for example, a silicon oxide (SiOx) film, a silicon nitride (SiNx) film, a silicon oxide nitride (SiOxNy; x>y) film, a silicon nitride oxide (SiNxOy; x>y) film, or the like may be used as appropriate.

Thereafter, a transparent common electrode 21 is formed on the third insulating layer 22. The common electrode 21 is obtained by, for example, forming a transparent conductive film such as an ITO (indium tin oxide) film, an IZO film, or a ZnO film (zinc oxide film), and patterning it. The common electrode 21 may be formed in substantially the entire display region 102, except for region located above the second thin film transistors 10B, for example. In this manner, the active matrix substrate 300 according to the present embodiment is obtained.

In the present embodiment, the third insulating layer 22 does not need to have any apertures made within the apertures 25. Therefore, the size (contact hole diameter) of each aperture 25 can be made smaller than the size of each aperture 25 as shown in FIG. 6(b).

Although not shown, FFS mode display devices may also be supported by altering the planar pattern of the common electrode 21, for example. Furthermore, IPS mode display devices may also be supported by altering the planar pattern of the pixel electrodes 23.

Note that the pixel electrode structure of the active matrix substrate 300 is not limited to the structure described above. The pixel electrodes may be disposed above the common electrode (i.e., so as to face the display medium layer such as a liquid crystal layer). Alternatively, as shown in FIG. 13, it may be a single-layer structure including pixel electrodes alone.

By using the active matrix substrate 300, as in the first embodiment, a display device which has a high resolution, low power consumption, and a narrow frame can be realized. Moreover, similarly to the first embodiment, while suppressing increase in the number of production steps and the production cost, the first thin film transistors 10A and the second thin film transistors 10B can be formed on the same substrate 11.

Embodiments of the semiconductor device according to the present invention are not limited to the first and second embodiments described above. The respective structures of the thin film transistors 10A and 10B are also not limited to the structures shown in FIG. 4 and FIG. 8. For example, although in the above embodiments the thin film transistors 10A and 10B have a single drain structure, an LDD (Lightly Doped Drain) structure or a GOLD (Gate-Overlapped LDD) structure in which LDD regions overlap gate electrodes may be adopted for enhanced reliability. Moreover, as necessary, channel doping may be applied to the crystalline silicon semiconductor layer 13 for the sake of threshold voltage control. Furthermore, the first thin film transistors 10A and the second thin film transistors 10B may each have either a bottom gate structure or a top gate structure. Instead of having a multilayer structure as described above, the second insulating layer 16 may be of a single layer.

In semiconductor devices according to embodiment of the present invention, the purposes of the first thin film transistors 10A and the second thin film transistors 10B and the regions in which they are formed are not limited to the purposes and regions described above. In the present embodiments, in a device including a plurality of TFTs, the first thin film transistors 10A and second thin film transistors 10B may at least be allocated to different characteristics that are required of the respective TFTs. The second thin film transistors 10B may not only be used as the pixel TFTs in the display region 102, but also be used as circuit elements in the driving circuit forming region 101. For example, in the driving circuit, second thin film transistors 10B may be adopted as any TFTs which do not require a high ON current but conversely require a low leakage current in an OFF state.

Embodiments of the present invention are not limited to active matrix substrates, but are applicable to various devices which include a plurality of thin film transistors. For example, they are broadly applicable to circuit boards, display devices, electronic appliances, and the like. Thus, through the use of TFTs which accommodate required characteristics, it becomes possible to enhance the performance and reliability of a semiconductor device and downsize it.

Method of producing semiconductor devices according to embodiments of the present invention are also not limited to the methods described in the above embodiments.

For example, when creating a CMOS circuit by using the first thin film transistors 10A, after a plurality of crystalline silicon semiconductor layers 13 are formed, in a step of implanting impurity ions into the crystalline silicon semiconductor layers 13, an impurity of a first conductivity type may be implanted while covering portions of the crystalline silicon semiconductor layer 13 with a mask such as a photoresist, and an impurity of a second conductivity type may be implanted while covering other portions of the crystalline silicon semiconductor layer 13 with another mask. By thus distinguishably implanting an n type impurity and a p type impurity into the respective crystalline silicon semiconductor layers 13, TFTs of desired conductivity types can be formed.

The method of crystallizing the amorphous oxide semiconductor film (or the amorphous oxide semiconductor layer) is also not limited to the above-described method based on a heat treatment. Although the method achieves crystallization of the amorphous oxide semiconductor film and hydrogen termination of the crystalline silicon semiconductor layer 13 in the same heating step, these processes may be accomplished in separate steps.

Moreover, the method of crystallizing the a-Si film is not limited to a laser-based method. For example, a catalytic metal which promotes crystallization (e.g., nickel) may be added to the a-Si film, and a heat treatment (e.g. not less than 550° C. and not more than 650° C.) may be performed to effect solid phase crystallization of the a-Si film. Alternatively, the film which has thus undergone solid phase crystallization may further be irradiated with laser light for enhanced crystallinity. A film having the high crystallinity thus obtained may have a higher mobility than that of a usual polysilicon film (e.g., a mobility which is about twice as high as that of a usual polysilicon film). Therefore, by using a film whose crystallinity has been enhanced by the aforementioned method as active layers of the first thin film transistors 10A, the area of the driving circuit can be reduced even more effectively.

INDUSTRIAL APPLICABILITY

Embodiments of the present invention are broadly applicable to devices or electronic appliances including a plurality of thin film transistors. For example, they are applicable to circuit boards such as active matrix substrates; display devices such as liquid crystal display devices, organic electroluminescence (EL) display devices, and inorganic electroluminescence display devices; imaging devices such as radiation detectors and image sensors; electronic devices such as image input devices and fingerprint reader devices; and the like.

REFERENCE SIGNS LIST 10A first thin film transistor
10B second thin film transistor
11 substrate
12 underlying film
13 crystalline silicon semiconductor layer
13c active region
13d drain region
13s source region
14 first insulating layer
15A gate electrode
15B gate electrode
16 second insulating layer
16a hydrogen donor layer
16b oxygen donor layer
17 crystalline oxide semiconductor layer
17c active region
17d drain contact region
17s source contact region
18dA drain electrode
18dB drain electrode
18sA source electrode
18sB source electrode
19 passivation film
20 planarization film
21 common electrode
22 third insulating layer
23 pixel electrode
25 aperture
40 gate driver circuit
50 driver IC
60 SSD circuit
70 check circuit
100 semiconductor device
101 driving circuit forming region
102 display region
104 excimer laser light
108 impurity
200, 300 active matrix substrate

The invention claimed is:

1. A semiconductor device comprising:
a substrate;
a first thin film transistor on the substrate, the first thin film transistor including a first active region which includes a crystalline silicon; and
a second thin film transistor on the substrate, the second thin film transistor including a second active region which includes an oxide semiconductor including a crystalline portion, wherein
a first layer in which the first active region is defined and a second layer in which the second active region is defined are provided in separate layers, the semiconductor device further including an insulating layer between the first layer and the second layer,
when viewed from a normal direction to the substrate, the insulating layer overlaps both of the first active region and the second active region,
the insulating layer includes a multilayer structure including a hydrogen donor layer that supplies hydrogen and an oxygen donor layer that supplies oxygen, the oxygen donor layer being located closer to the second active region than the hydrogen donor layer,
the hydrogen donor layer is thicker than the oxygen donor layer, a thickness of the hydrogen donor layer being not less than 150 nm and not more than 450 nm and a thickness of the oxygen donor layer being not less than 30 nm and not more than 100 nm,
the semiconductor device further includes:
a display region including a plurality of pixels; and
a driving circuit defining region in a region other than the display region, the driving circuit defining region including a driver and a source shared driving circuit; and the first thin film transistor is included in the source shared driving circuit and the second thin film transistor is provided for each of the plurality of pixels of the display region.

2. The semiconductor device of claim 1, further comprising a first interlayer insulating film covering the first thin film transistor, wherein
the insulating layer defines the first interlayer insulating film and a gate insulating film of the second thin film transistor.

3. The semiconductor device of claim 1, wherein, in the insulating layer, the hydrogen donor layer includes silicon nitride, and the oxygen donor layer includes silicon oxide.

4. The semiconductor device of claim 1, wherein a gate electrode of the first thin film transistor and a gate electrode of the second thin film transistor are in a same layer.

5. The semiconductor device of claim 1, wherein a source electrode and a drain electrode of the first thin film transistor and a source electrode and a drain electrode of the second thin film transistor are in a same layer.

6. The semiconductor device of claim 1, wherein the oxide semiconductor comprises an In—Ga—Zn—O type semiconductor.

7. The semiconductor device of claim 1, wherein the first thin film transistor has a top gate structure, and the second thin film transistor has a bottom gate structure.

8. The semiconductor device of claim 1, wherein the crystalline silicon is a polycrystalline silicon.

9. The semiconductor device of claim 1 further comprising a passivation film covering the first thin film transistor and the second thin film transistor, wherein
a source electrode and a drain electrode of the second thin film transistor are on a layer in which the second active region is provided; and
the passivation film is in contact with the second active region, the source electrode, and the drain electrode of the second thin film transistor.

10. The semiconductor device of claim 9, wherein the passivation film includes a lower layer of a silicon oxide film and an upper layer of a silicon nitride film.

11. The semiconductor device of claim 1, wherein, in the insulating layer, the hydrogen donor layer includes silicon nitride oxide (SiNxOy, where x>y).

12. The semiconductor device of claim 1, wherein, in the insulating layer, the oxygen donor layer includes silicon oxide nitride (SiOyNx, where y>x).

13. A semiconductor device comprising:
a substrate;
a first thin film transistor on the substrate, the first thin film transistor including a first active region which includes a crystalline silicon; and
a second thin film transistor on the substrate, the second thin film transistor including a second active region which includes an oxide semiconductor including a crystalline portion, wherein
a first layer in which the first active region is defined and a second layer in which the second active region is defined are provided in separate layers, the semiconductor device further including an insulating layer between the first layer and the second layer,
when viewed from a direction normal to the substrate, the insulating layer overlaps both of the first active region and the second active region,
the insulating layer includes a multilayer structure including a hydrogen donor layer that supplies hydrogen and an oxygen donor layer that supplies oxygen, the oxygen donor layer being located closer to the second active region than is the hydrogen donor layer, and
the hydrogen donor layer is thicker than the oxygen donor layer, a thickness of the hydrogen donor layer being not less than 150 nm and not more than 450 nm and a thickness of the oxygen donor layer being not less than 30 nm and not more than 100 nm.

* * * * *